United States Patent
McKenney et al.

(10) Patent No.: US 6,448,524 B1
(45) Date of Patent: Sep. 10, 2002

(54) CIRCUIT BOARD HANDLER

(75) Inventors: Jeff McKenney, Garden Grove; Steve Ogren, Yorba Linda; Med Esfahani, Misison Viejo, all of CA (US)

(73) Assignee: Nortek Automation, Inc., Huntington Beach, CA (US)

( * ) Notice: Subject to any disclaimer, the term of this patent is extended or adjusted under 35 U.S.C. 154(b) by 0 days.

(21) Appl. No.: 09/804,123

(22) Filed: Mar. 9, 2001

Related U.S. Application Data

(60) Provisional application No. 60/192,701, filed on Mar. 28, 2000.

(51) Int. Cl.[7] .............................................. B07C 5/344
(52) U.S. Cl. ........................ 209/573; 209/571; 209/916
(58) Field of Search ................................ 209/571–573, 209/651, 653, 655, 911, 912, 916, 909, 927

(56) References Cited

U.S. PATENT DOCUMENTS

| | | | |
|---|---|---|---|
| 5,704,489 A | | 1/1998 | Smith |
| 5,954,205 A | * | 9/1999 | Smith ............................ 209/2 |
| 5,973,285 A | * | 10/1999 | Dietrich et al. ............. 209/573 |
| 6,049,421 A | | 4/2000 | Ho |

OTHER PUBLICATIONS

Statement of Undisputed Facts and Conclusions of Law Under Federal Rule 56 (A) in Support of Counterdefendant's 12(B) (6) Motion for Failure to State a Claim Upon Which Relief May be Granted—Nortek Automation Inc. vs. Paul Smith, an individual and dba Simmpro, United States District Court, Central District of California, Case No. SACV 98–79 AHS (EEx), 11 pages.

Settlement Agreement, Feb. 12, 1999, in United States District Court, Central District of California, Southern Division, Civil Action No. SACV 98–79 AHS (EEx) Entitled Nortek Automation, Inc., et al. v. Paul Smith dba Simmpro, 9 pages.

Redacted Settlement Agreement and Release, Jun. 7, 2000, in United States District Court, Central District of California, Southern Division, Civil Action No. SACV 98–79 AHS (EEx) Entitled Nortek Automation, Inc., et al. v. Paul Smith dba Simmpro, 9 pages.

* cited by examiner

*Primary Examiner*—Donald P. Walsh
*Assistant Examiner*—Joseph C Rodriguez
(74) *Attorney, Agent, or Firm*—James G. O'Neill

(57) ABSTRACT

The present invention relates to a SIMM/DIMM board handler, which enables a single test site handling machine to be integrated into an inline, multi-site test cell, and includes an angled conveyor belt, an angled fail tray for transporting and sorting tested circuit boards and an adjustable circuit probe for performing separate testing of circuit boards.

17 Claims, 7 Drawing Sheets

*Fig. 6*   *Prior Art*

CIRCUIT BOARD HANDLER

CROSS-REFERENCE TO RELATED APPLICATION

This application is a continuation of pending provisional application Ser. No. 60/192,701 filed Mar. 28, 2000.

BACKGROUND OF THE INVENTION

1. Field of the Invention

The invention relates generally to parts handling equipment, and more particularly to an improved electronic circuit board handling and testing apparatus that is adapted to position each of an inventory of identical circuit boards into a test fixture and, subsequent to the completion of a testing protocol, sort each board in accordance with a test result. Multiple machines may be positioned in-line such that all sorted GOOD circuit boards are transported to a single location at the end of the line.

The present invention is particularly adapted for handling and testing of small printed circuit boards, which include one or more memory devices typically referred to as Memory Modules, SIMM boards, DIMM boards, and RIMM boards.

2. Description of Related Art

Single Test Site, Gravity Operation

Known circuit board handlers, such as U.S. Pat. No. 5,704,489 to Smith ("Smith '489"), deposit sorted circuit boards by using gravity and a diverting mechanism to direct boards down one of a pair of exit chutes into a pass or fail bin or containment vessel. A GOOD collection bin and a BAD collection bin are required for each handler. However, high volume production environments may use ten to fifty single site test handlers.

The use of gravity and the diverting mechanism of the Smith patent cause undesired forces to be exerted on the circuit boards as they bounce down the exit chute. The undesired forces can cause damage to components mounted on the circuit boards.

Additionally, forces exerted on boards as they fall into a collection bin from the exit chute can also cause damage to components on the circuit board. Components on circuit boards lying in the collection bin also may be damaged as newly sorted boards are dropped onto them.

Magazine Sleeve, Singulator Mechanism and Adjustable Circuit Probe

Known circuit board handlers, such as disclosed in Smith '489, typically include magazine sleeves of several sizes, each of which is adapted to accommodate a plurality of circuit boards of corresponding width. The circuit boards are stacked one on top of each other within the magazine sleeve.

The known circuit board handlers, such as Smith '489, include a singulator mechanism having the magazine sleeves releasably attached directly above the singulator mechanism. The singulator mechanism performs a sequence of steps to drop a single circuit board from the bottom of the stack of boards held in the magazine sleeve. The separated or "singulated" circuit board is dropped from the magazine assembly onto a shelf member of a testing assembly and then pushed into the modular-testing component of the testing assembly. Such circuit board handlers can potentially cause damage to components, due to dropping the entire stack the height of one circuit board. As the entire stack is dropped within the magazine sleeve, relative motion between the circuit boards causes interference between components mounted on the bottom of one board with components mounted on the top of the circuit board stacked immediately adjacent. Additionally, such known circuit board handlers are limited in the number and/or type of tests that may be performed on each circuit board.

Furthermore, the known circuit board handlers can potentially cause damage to components by allowing operators to improperly load the circuit boards into the magazine sleeve. For example, circuit boards may be loaded upside down causing a misalignment of the circuit board contacts with the testing apparatus contacts.

Potential Component Damage, Singulation Sequence, Adjustable Circuit Probe

The singulation sequence, performed on known circuit board handlers, such as Smith '489, can potentially damage components mounted on the circuit boards. The singulation sequence causes the lowermost circuit board to drop from the bottom of the stack onto a shelf member. The singulation sequence then causes the entire stack to drop the equivalent of the height of one circuit board.

Additionally, the known circuit board handlers can potentially cause damage to components, due to mechanical interference between the singulator mechanism and components mounted near the edge of the circuit board.

Also, the known circuit board handlers can potentially cause damage to components, due to dropping a single circuit board onto the shelf member.

Furthermore, the known circuit board handlers do not reliably control the extension of the singulator block. The singulator blocks in known handlers are screwed onto a cylinder shaft and retained with thread locking adhesive. Inherent problems in this design include variation in the extension of the cylinder shaft, non reusable cylinders due to the thread retaining adhesive, and cylinder bumper wear. These problems result in component damage due to varying upper and lower ledge retainers, such as Smith '489.

Finally, the known circuit board handlers are limited in what tests they may perform, as well as where circuit boards may be tested.

Modular Test Assembly, Connectors, Adjustable Circuit Probe

The known circuit board handlers utilize a "Zero Insertion Force" (ZIF) contact mechanism. The contact fixture uses a set of gold plated, metal fingers, which must be flexed or forced into position to make electrical contact with connector pads on the circuit board under test. The gold plated, metal fingers of the ZIF contact fixture used on known circuit board handlers must be manufactured to a required length to allow for flexing of the fingers to contact the circuit board under test. The required length of the metal fingers is detrimental to higher frequency test signals. Complete testing at high frequency operation is not possible using the metal fingers used on known handlers. Additionally, no tests on the circuit board may be performed outside of the text fixture.

Furthermore, the gold plated, metal fingers of the ZIF contact fixture are susceptible to breaking, are expensive and are manufactured by a single source only.

Therefore, there exists a need in the circuit board handler art for an improved handler that overcomes the above-mentioned problems, and allows at least one additional test to be performed on circuit boards by an adjustable circuit probe.

SUMMARY OF THE INVENTION

In accordance with the present invention there is provided a circuit board handling and testing apparatus (i.e., handler), which comprises a housing defining a stationary top surface. Attached to the housing of the present invention are an improved singulating mechanism, an improved magazine assembly, an improved modular test component, a new conveyor transport assembly, and an adjustable circuit probe for performing additional testing.

In a preferred embodiment of the present invention, the new conveyor transport mechanism is mounted directly below a pivotal shelf member, which is used to eject circuit boards from a testing assembly and/or adjustable circuit probe. The conveyor transport extends out of the sides, beyond a housing of the handler. This allows individual machines, built in accordance with the present invention, to be installed next to each other and transport sorted GOOD circuit boards from one machine through multiple machines in a line to a single destination, instead of individual bins at each machine.

The conveyor transport and the unique workings of a fail tray included in the present invention eliminate the use of a divert mechanism, such as disclosed in the Smith '489 patent, thus eliminating risk of damage to components during the sorting process.

The improved magazine assembly uses precision guide rails to hold stacked circuit boards in relative position thus minimizing risk of damage to components mounted on the circuit boards.

The materials and design of the singulating mechanism of the present invention have been improved for increased reliability of the singulation process and minimized risk of damage to components mounted on the circuit boards. In the preferred embodiment of the present invention, the modular test assembly has been improved to accommodate a wider range of test connectors thus allowing test systems to test the circuit boards at higher frequencies.

The addition of an adjustable circuit probe, between a magazine and a modular test assembly, allows the present invention to perform additional testing of circuit boards.

The improvements regarding the magazine sleeve, the singulator mechanism, the modular test assembly and the adjustable circuit probe of the present invention are also useful on known handlers.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, in which:

FIG. 6 is an improved circuit board ejector assembly of the present invention;

DESCRIPTION OF THE PREFERRED EMBODIMENT

The present invention is an improvement to the circuit board handler disclosed in U.S. Pat. No. 5,704,489 to Smith (Smith '489"). The disclosure of the Smith '489 patent is incorporated herein, in its entirety, by this reference thereto.
Modular Handler, Conveyor Transport As best shown in FIGS. 1–3 and 7, circuit board handlers 10 constructed in accordance with the present invention include an angled conveyor transport mechanism 13, which allows individual machines to be modularly inserted into a single multi-site, in-line test cell (see FIG. 3).

Figure 1:
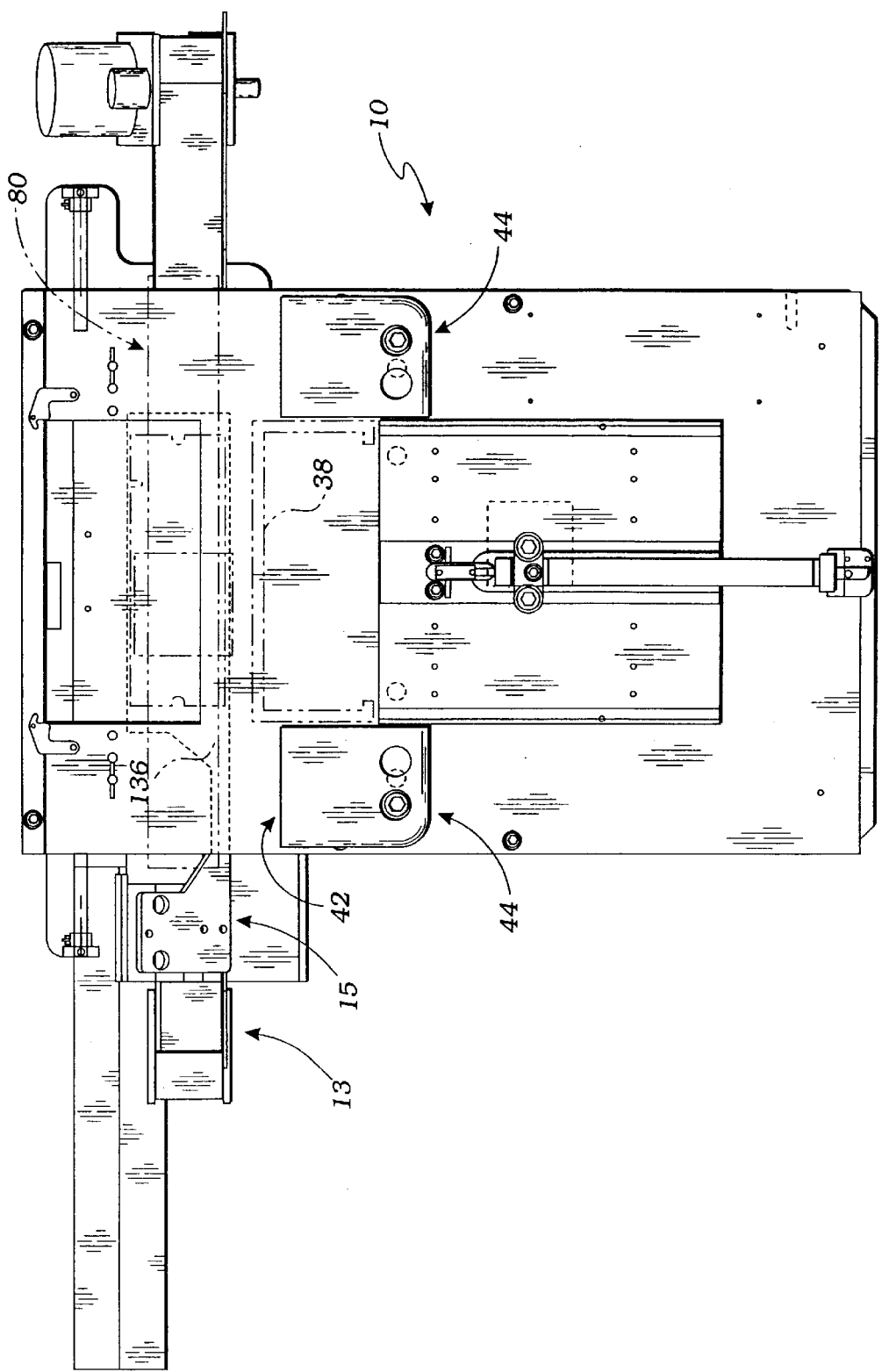
FIG. 1 is a top plan view of a circuit board handler with a conveyor transport mechanism and adjustable circuit probe, in accordance with the present invention.
Figure 2:
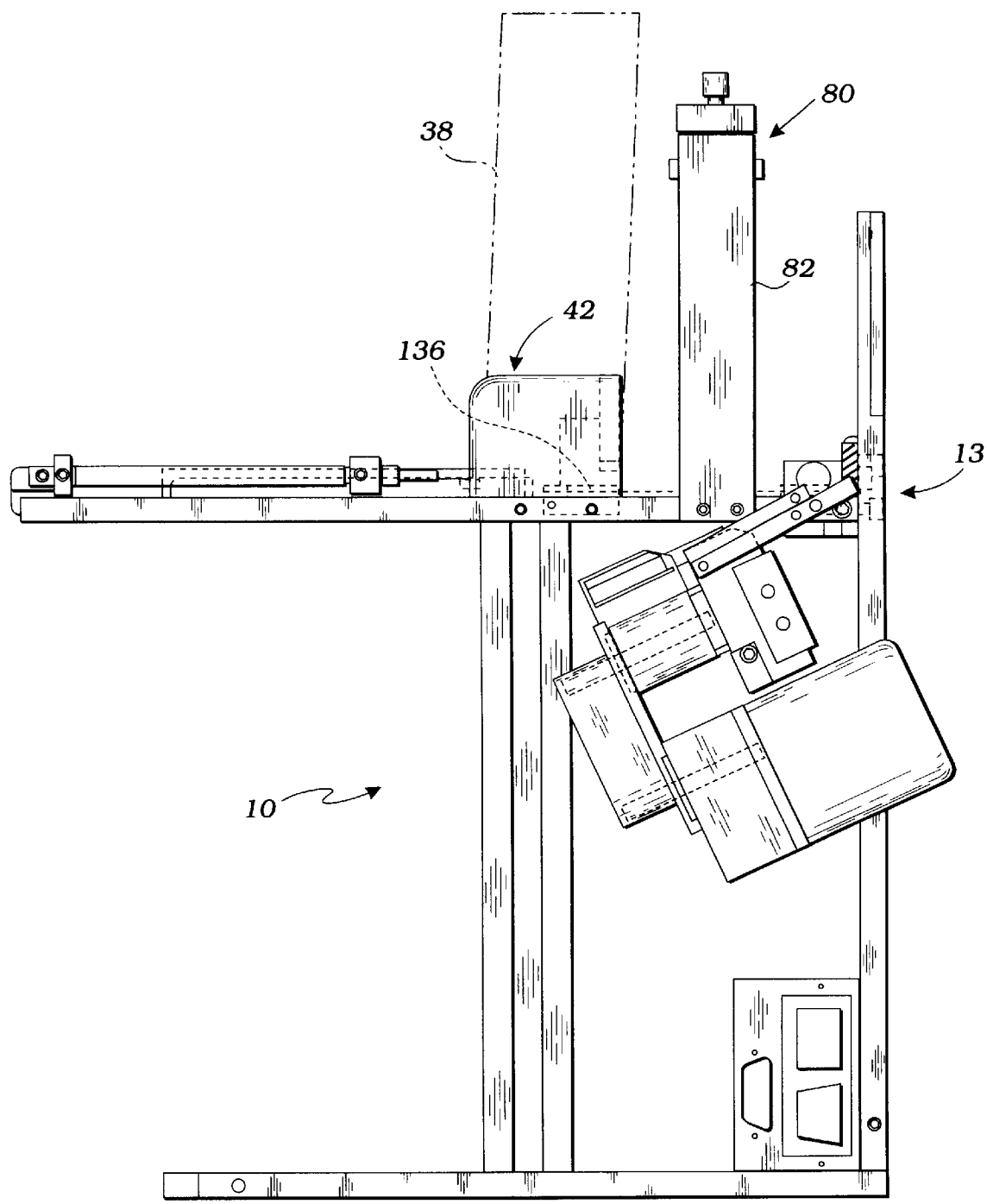
FIG. 2 is a side elevational view of the circuit board handler, adjustable circuit probe and conveyor transport mechanism of FIG. 1.
Figure 3:
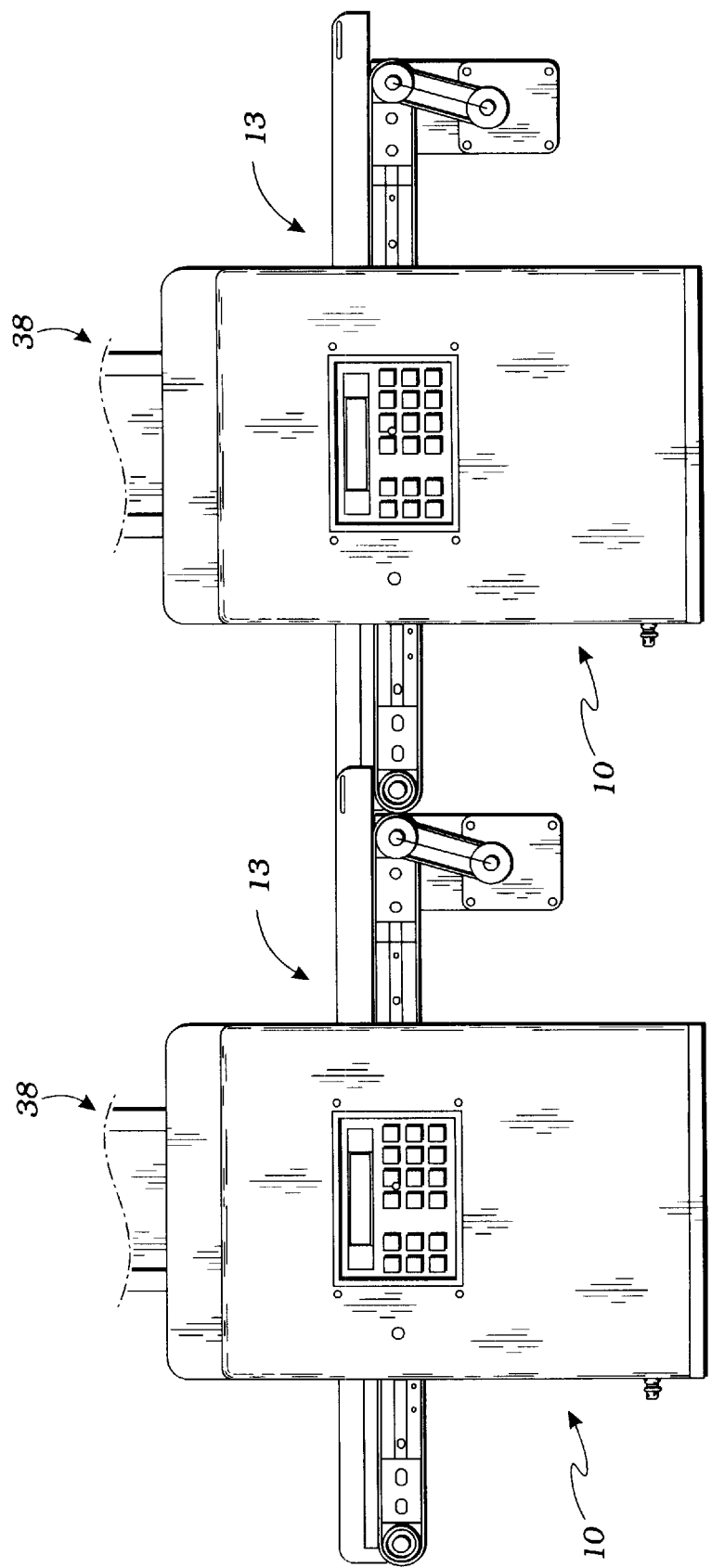
FIG. 3 is a front elevational view of multiple circuit board handlers of the present invention connected together in-line.
Figure 4:
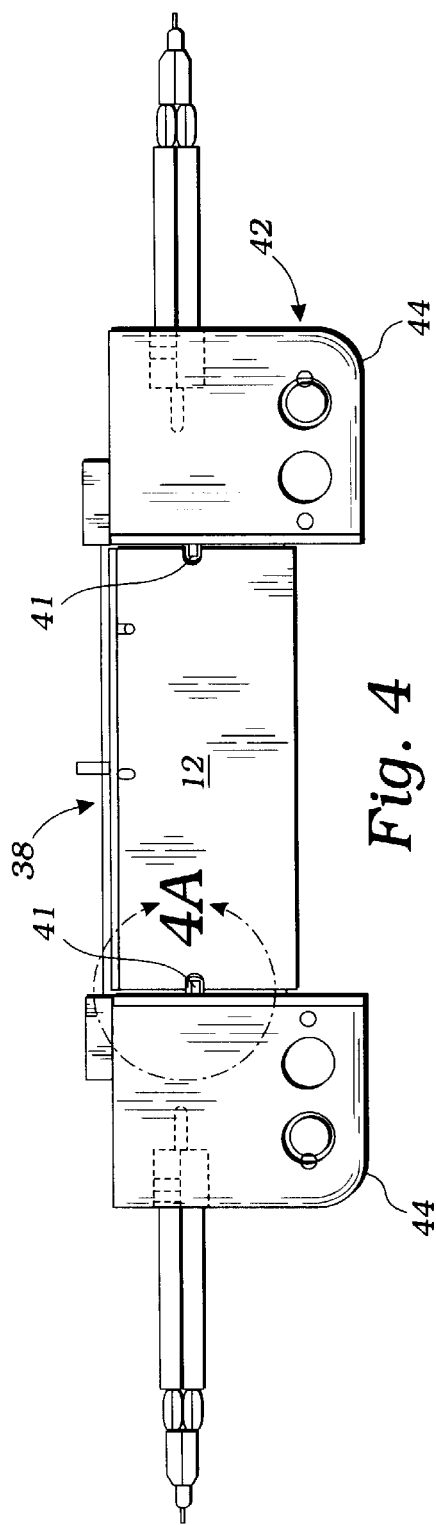
FIG. 4 is a plan view of an improved magazine assembly having precision guides of the present invention therein.
Figure 4A:
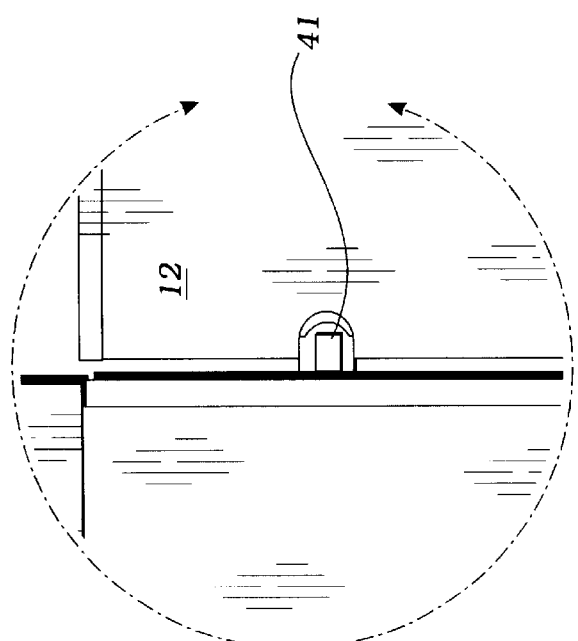
FIG. 4A is an enlarged partial sectional view taken along line 4A of FIG. 4.
Figure 7:
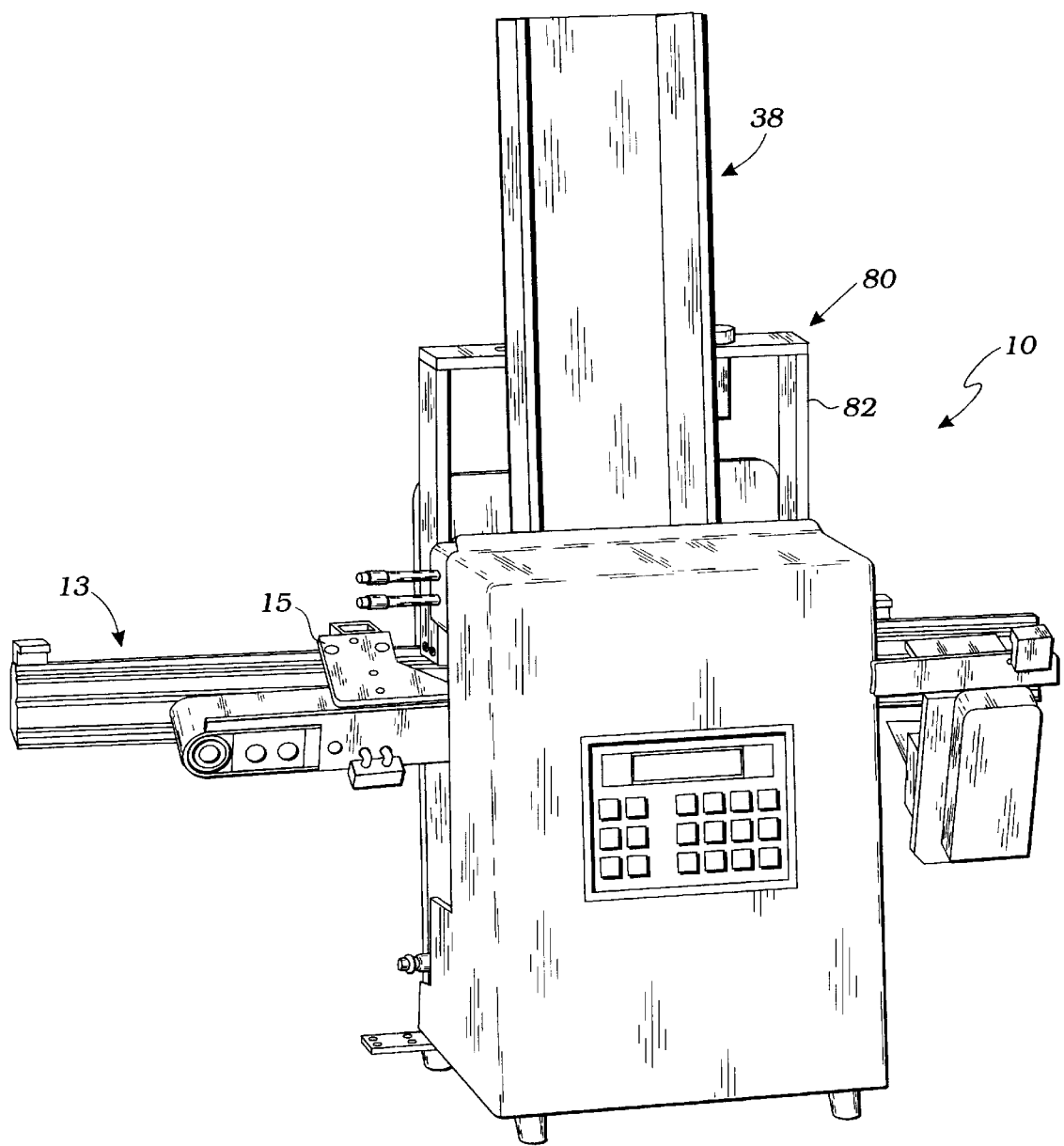
FIG. 7 is a front perspective view of a circuit board handler, adjustable circuit probe and conveyer system, having a magazine assembly thereon, in accordance with the present invention.
Figure 8:
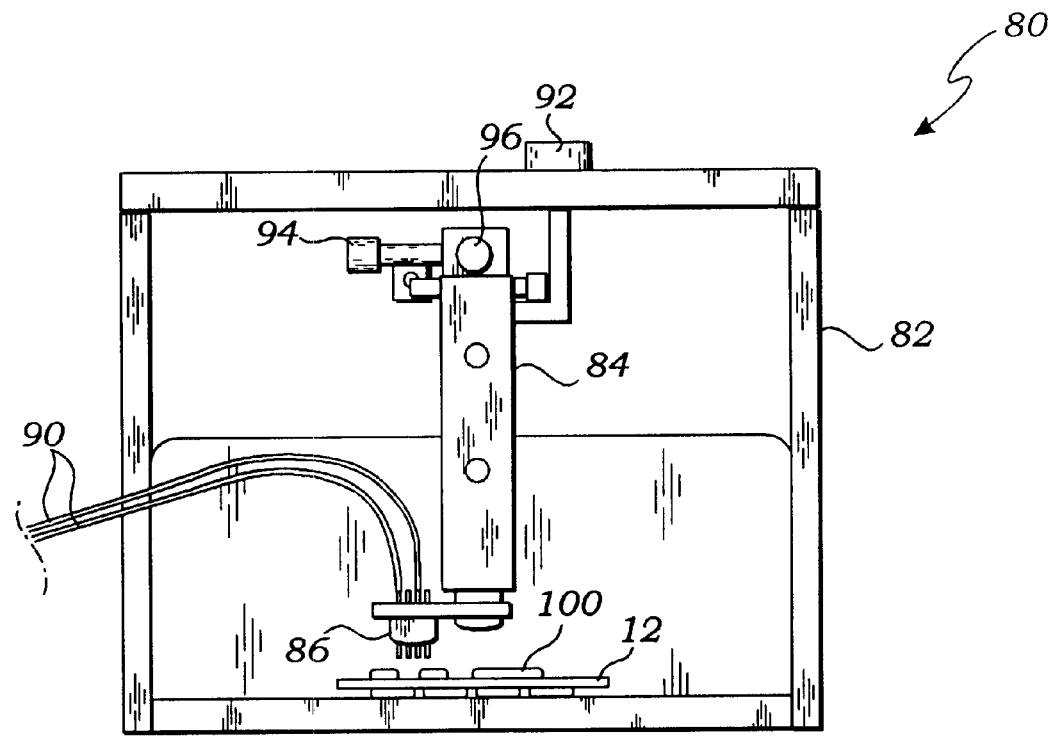
FIGS. 8 and 9 are front elevational view of one embodiment of the adjustable circuit probe of the present invention.
Figure 9:
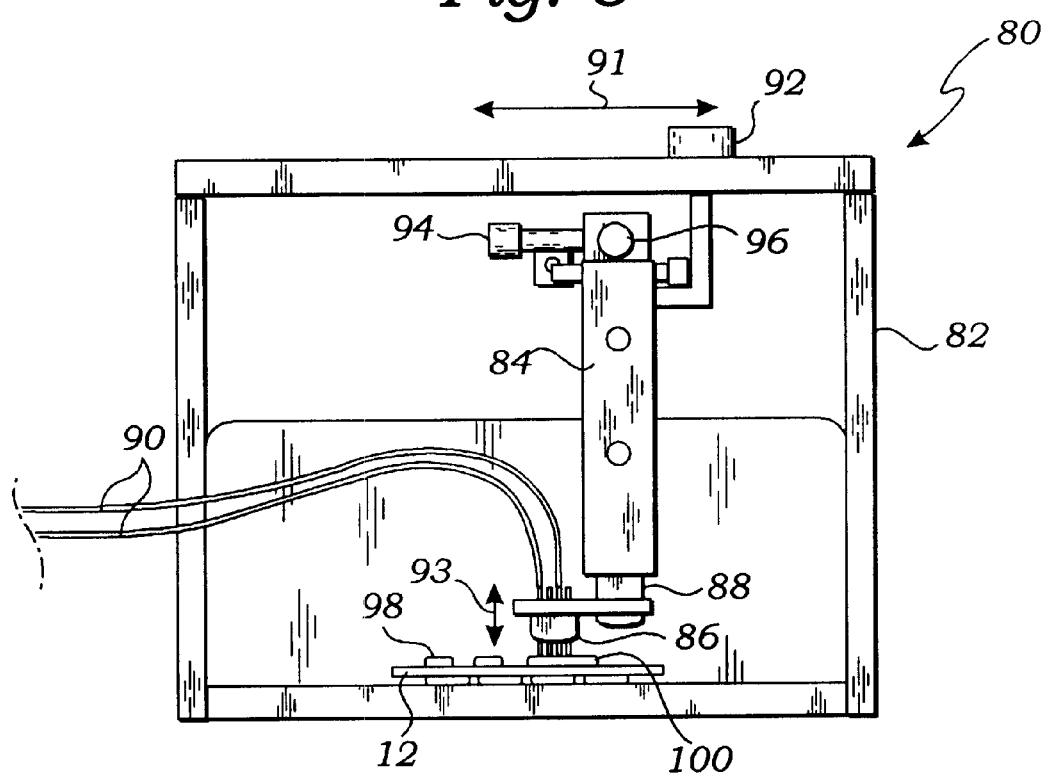

The angled conveyor transport 13 is preferably angled at between 20°–30°, with 25° being a currently preferred angle. A fail tray 15, which eliminates the sort mechanism of the Smith '489 patent, is mounted spaced from the conveyor 13, at the same angle. As a default, the fail tray 15 interrupts the transition of a tested circuit board onto the conveyor 13. When a board is sorted to GOOD, the fail tray 15 slides to the left, as shown in FIGS. 1 and 7, and allows the GOOD board to directly transition onto the conveyor 13, for transport to a further machine or collection site. When a board is sorted to fail, the fail tray 15 remains in place (shown in broken line in FIG. 1) until a failed board is received. Once a failed board is received, the fail tray 15 slides to the left to sort the failed board. While inside the unit 10, a guide (not shown) for the conveyor acts as a guide for the failed board. Once outside the handler 10, a step in the guide allows the failed board to slide off the fail tray 15 to fall by gravity and into a fail bin (not shown), beside the handler 10.

The angled conveyor 13 and angled fail tray 15 of the present invention are circuit board friendly. Their angle corresponds to the angle a pivotal shelf or tray 136 takes, when it is used to eject circuit boards from the test assembly in a known manner. The angled conveyor, which directly receives GOOD boards from the pivotal shelf 136 eliminates dropping the GOOD boards from the pivotal shelf member onto a sort tray as used in Smith '489. On handlers built in accordance with Smith '489, the ends of the board drop in excess of five inches, causing problems if they land improperly. The angled design of the conveyor and fail tray of the present invention provides a parallel sorting transition. The result is a safe and controlled sorting method.

To maintain reliability and increase cycle time, sensors monitor the entire process. The fail tray 15 has extend and retract sensors to ensure proper timing and to monitor any jams. The fail tray 15 also contains a further sensor to ensure that any board therein has exited the tray properly.

The modular design of the present invention allows simple line expansion or reduction of multi-site test cells. This invention also maintains left/right sortation.

Multiple machines built in accordance with the present invention use the same GOOD bin or circuit board loader.

Space for individual GOOD bins is eliminated allowing more tabletop space in production areas. The present invention maintains standard height and tabletop mounting. This is an important ergonomic consideration for operators.

Figure 6A:
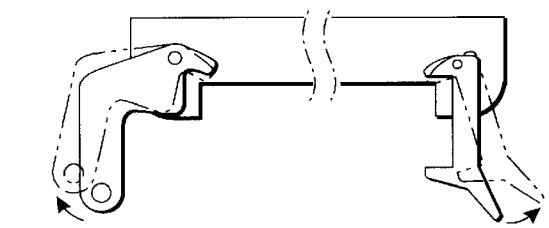
FIG. 6A illustrates a prior art circuit board ejector assembly.

The present invention also maintains default to FAIL operation, and includes an improved circuit board ejector (see FIGS. 1 and 6).

Magazine Assembly Improvements

As shown in FIGS. 1, 3, 4, 4A and 7, a magazine assembly 38 mounted on the circuit board handler 10 of the present invention uses precision guide rails 41, to position a stack of circuit boards 12. Utilizing the standard connector notch defined in JEDEC standards for memory module circuit boards, the guide rails 41 define surfaces on both sides of the boards that positively contain the circuit boards in two degrees of freedom.

The precision guide rails 41 eliminate motion of any one circuit board 12, relative to an entire stack, thus eliminating interference problems between components mounted on the bottom of one board with components mounted on the top of the circuit board stacked immediately adjacent.

The magazine assembly 38 on the circuit board handler 10 of the present invention uses the adjustable, locating, guide rail 41 (see FIG. 4A) to match the position of a polarizing keyway found on memory board circuit boards. This locating guide rail 41 eliminates operator error by allowing a single, unique, loading orientation. The circuit boards cannot be loaded upside down when the polarizing keyway on the circuit board is matched to the guide rail.

Singulator Improvements

A singulator mechanism 42 having two separate support blocks 44 on the circuit board handler 10 of the present invention utilizes precise extension control. The extension of a singulator block 44 is governed by a toleranced stop. The toleranced stop controls exactly how far the singulator block 44 extends under and over a circuit board. In addition, the singulator mechanism 42 is dowel pinned to a top plate of the circuit board handler 10, therefore, precisely controlling the overall block extension relative to a circuit board. This new design also allows for the replacement of cylinders with use of lock nuts, rather than thread locking adhesive, to retain the blocks.

Figure 5:
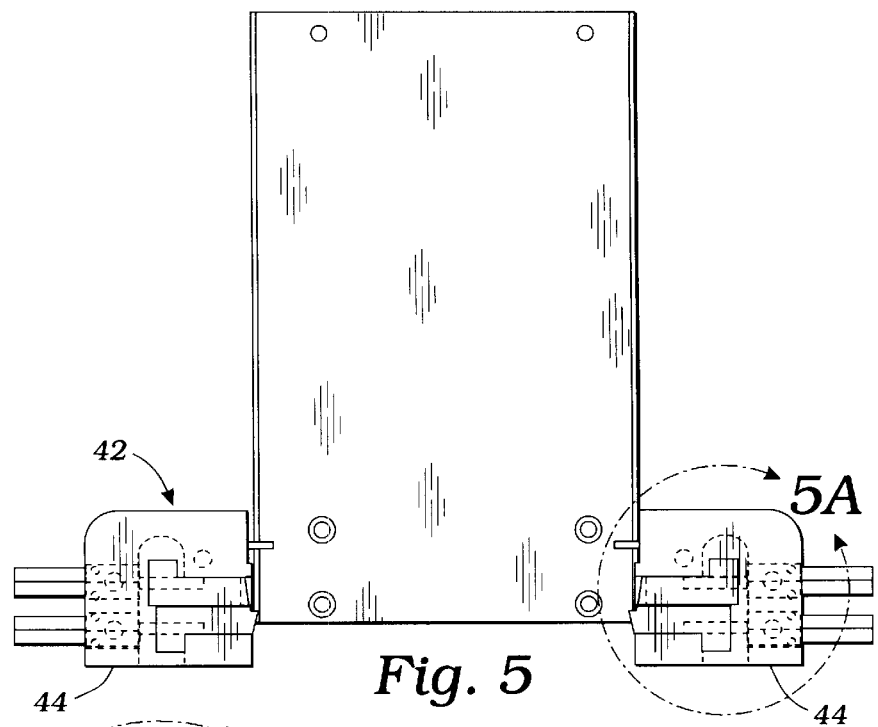
FIG. 5 is a top plan view of an improved singulator mechanism of the present invention.
Figure 5A:
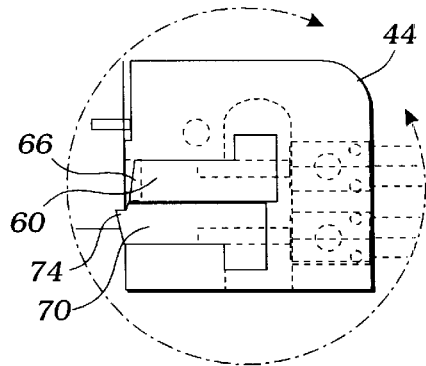
FIG. 5A is an enlarged partial sectional view taken along line 5A of FIG. 5.
Figure 5C:
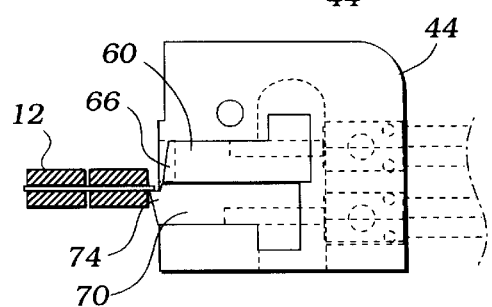
FIGS. 5B and 5C illustrate operation of the singulator mechanism of FIG. 5.
Figure 5B:
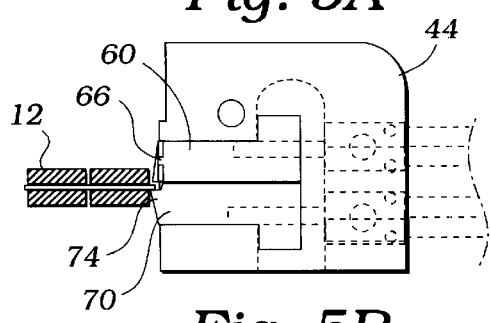

The singulator mechanism 42, shown in FIGS. 5–5B, includes guides that are made out of aluminum. The singulator 42 include upper and lower parts 60, 70, that are preferably made out of stainless steel (upper 60) and brass (lower 70). Using three different materials allows the singulator 42 to slide with little friction and it enables control over wear surfaces.

The upper singulator 60 made from stainless steel is extremely strong, virtually eliminating any notch from forming due to wear on aluminum singulators made in accordance with the prior art.

The upper singulator 60 includes a chamfer 66 that has been shortened with respect to known devices, even more to handle present day circuit boards 12 with components mounted closer to the edges. The height of the upper singulator has been increased to hold low profile chips, such as Thin Small Outline Package (TSOP) equipped modules, by a small step 74 in the lower singulator 70.

The lower singulator step 74 is approximately 0.062, and is, therefore, capable of handling the majority of memory circuit boards currently on the market when used with the new upper singulator. In addition, small radii on edges of approximately 0.30″ on the lower singulator 70 helps eliminate component damage.

Extension stops on upper cylinders operating the upper singulators 60, along with flow controls, keep modules held therein from dropping and lined up straight. These modifications have proven very successful for eliminating multiple board drop problems and damage to components near, or at the edge of the module.

Modular Test Assembly Improvements

Circuit board handlers 10 constructed in accordance with the present invention include an improved modular test assembly. The improved test assembly allows the use of standard circuit board connectors on the testing apparatus. Use of standard circuit board connectors eliminates the longer circuit lengths required by the gold plated, metal fingers of the ZIF contact fixture used on circuit board handlers constructed in accordance with the Smith '489 patent. Reducing the circuit lengths allows testing at much higher frequencies as required by the latest circuit board technology. Furthermore, the improved circuit board ejectors shown in FIGS. 1 and 6 more precisely control the ejection of circuit boards 12 from the test assembly and eliminates any chance of damaging the boards.

Adjustable Circuit Probe

As best shown in FIGS. 1, 2 and 7–9, to enable the circuit board handler 10 of the present invention to perform at least one additional or extra test on circuit boards 12, an adjustable circuit probe 80 is secured to the top surface of the handler.

The circuit probe 80 includes a frame or gantry mount 82 from which is suspended a movable element 84 having a probe 86 secured to a lower end 88 thereof. The probe 86 is electrically connected, as by means of leads or wires 90, to a test instrument (not shown). The frame or gantry mount 82 includes a coarse adjustment knob or mechanism 92, to allow movement in the direction of arrow 91, 93 (see FIG. 9), as well as fine or micrometer X–Y adjustment means 94, 96, such as knobs. The adjusting means 92, 94, 96, allow the movable element 84 and probe 86 to be adjusted to test various components 98, 100 on circuit boards 12.

It, therefore, can be seen that after a circuit board 12 has been dropped from the magazine 38, it can be selectively tested with the handler 10 of the present invention. For example, normal testing, such as performed with existing handlers, can be done with the testing fixture, as explained above. Or, one or more additional tests or programming functions may be performed on circuit boards 12 by using the adjustable circuit probe 80 of the present invention.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A circuit board handling and testing apparatus, comprising:

a housing defining a top surface and two sides;

a magazine assembly attached to the housing for accommodating a plurality of circuit boards and dispensing the circuit boards one at a time; each of the circuit boards defining a longitudinal axis;

a testing assembly attached to the housing; the magazine assembly dispensing the circuit boards one at a time onto the testing assembly which includes a modular testing component for receiving the circuit board dispensed onto the testing assembly and performing a testing protocol thereon; the modular testing component being selectively removable from the testing assembly and replaceable with an alternative modular testing component;

a reciprocal transport assembly attached to the housing for pushing the circuit board dispensed onto the testing assembly laterally relative to its longitudinal axis into the modular testing component;

a circuit board conveyor system mounted at an angle to the top surface, passing through the housing between the two sides; and a reciprocating fail tray assembly mounted in the housing, at an angle to the top surface, for selectively directing the circuit board into a bad containment vessel, or allowing the circuit board to drop onto the circuit board conveyor system, based upon the outcome of the testing protocol;

the testing assembly ejecting the circuit board into the reciprocating fail tray assembly or the circuit board conveyor system, subsequent to the completion of the testing protocol.

2. The apparatus of claim 1 wherein the magazine assembly is an elongate sleeve releasably attached to a singulator mechanism, the sleeve being sized and configured to receive the circuit boards in stacked relation to each other; and including a pair of guide rails on opposed sides to guide the circuit boards within the sleeve.

3. The apparatus of claim 1 wherein the fail tray assembly and the circuit board conveyor system are mounted parallel to each other in the housing.

4. The apparatus of claim 3 wherein both the fail tray assembly and the circuit board conveyor system are mounted at an angle of between 20° and 30°, with respect to the top surface.

5. The apparatus of claim 1, further including an adjustable circuit probe attached to the housing; and wherein the circuit board conveyor system is below the reciprocating fail tray assembly.

6. The apparatus of claim 5 wherein the circuit board conveyor system is mounted at an angle of between 20° and 30°.

7. The apparatus of claim 6 wherein the reciprocating fail tray assembly is mounted parallel to the circuit board conveyor system.

8. The apparatus of claim 7 wherein the magazine assembly is an elongate sleeve releasably attached to a singulator mechanism, the sleeve being sized and configured to receive the circuit boards in stacked relation to each other; and including a pair of guide rails on opposed sides to guide the circuit boards within the sleeve.

9. The apparatus of claim 8, further including an adjustable circuit probe mounted to the top surface of the housing between the magazine assembly and the testing assembly.

10. The apparatus of claim 9 wherein the reciprocating fail tray is mounted on the top surface, above the circuit board conveyor system, and the adjustable circuit probe includes a movable element having coarse and fine adjustment means thereon.

11. The apparatus of claim 10 wherein the reciprocating fail tray is mounted at an angle of between 20° and 30°.

12. The apparatus of claim 11 wherein the magazine assembly is an elongate sleeve releasably attached to a singulator mechanism, the sleeve being sized and configured to receive the circuit boards in stacked relation to each other; and including a pair of guide rails on opposed sides to guide the circuit boards within the sleeve.

13. A circuit board handling and testing apparatus, comprising:

a housing defining a top surface and two sides;

a magazine assembly having an elongate sleeve and a singulator mechanism attached to the housing for accommodating a plurality of circuit boards and dispensing the circuit boards one at a time; each of the circuit boards defining a longitudinal axis;

a testing assembly attached to the housing; the magazine assembly dispensing the circuit boards one at a time onto the testing assembly which includes a modular testing component being selectively removable from the testing assembly and replaceable with an alternative modular testing component;

a reciprocal transport assembly attached to the housing for pushing the circuit board dispensed onto the testing assembly laterally relative to its longitudinal axis into the modular testing component;

a circuit board conveyor system passing through the housing between the two sides;

a reciprocating fail tray assembly attached to the housing for selectively directing the circuit board into a bad containment vessel, or allowing the circuit board to drop onto the circuit board conveyor system, based upon the outcome of the testing protocol;

the testing assembly including an ejector mechanism for ejecting the circuit board into the reciprocating fail tray assembly or the circuit board conveyor system, subsequent to the completion of the testing protocol; and the reciprocating fail tray assembly and the circuit board conveyor system are mounted at an angle and parallel to each other in the housing.

14. The apparatus of claim 13, further including an adjustable circuit probe on the top surface; and wherein the elongate sleeve is releasably attached to the singulator mechanism, and includes a pair of guide rails on opposed sides to guide the circuit boards within the sleeve.

15. The apparatus of claim 13 wherein the adjustable circuit probe includes a coarse adjustment knob and fine adjustment knobs; and both the reciprocating fail tray assembly and the circuit board conveyor system are mounted at an angle of between 20° and 30°, with respect to the top surface.

16. The apparatus of claim 15 wherein the angle is about 25°, and the adjustable circuit probe is electrically connected to a test instrument for independent testing of a circuit board.

17. A circuit board handling and testing apparatus, comprising:

a housing defining a top surface and two sides;

a magazine assembly having an elongate sleeve releasably attached to a singulator mechanism attached to the housing for accommodating a plurality of circuit boards and dispensing the circuit boards one at a time; each of the circuit boards defining a longitudinal axis;

the elongate sleeve including a pair of opposed guide rails for guiding the plurality of circuit boards;

a testing assembly attached to the housing; the elongate sleeve dispensing the circuit boards one at a time onto the testing assembly which includes a modular testing component for receiving the circuit board dispensed onto the testing assembly and performing a testing protocol thereon; the modular testing component being selectively removable from the testing assembly and replaceable with an alternative modular testing component;

a reciprocal transport assembly attached to the housing for pushing the circuit board dispensed onto the testing assembly laterally relative to its longitudinal axis into the modular testing component;

a circuit board conveyor system mounted at an angle of about 25° passing through the housing between the two sides;

a reciprocating fail tray assembly attached to the housing at an angle of about 25° above the circuit board conveyor system, for selectively directing the circuit board into a bad containment vessel, or allowing the circuit board to drop onto the circuit board conveyor system, based upon the outcome of the testing protocol;

the testing assembly including an ejector mechanism for ejecting the circuit board into the reciprocating fail tray assembly or the circuit board conveyor system, subsequent to the completion of the testing protocol; and an adjustable circuit probe mounted on the top surface, between the magazine assembly and the testing assembly for selectively performing at least one separate test on circuit boards.

\* \* \* \* \*